United States Patent
Yin

(10) Patent No.: US 6,661,655 B2
(45) Date of Patent: Dec. 9, 2003

(54) METHODS AND SYSTEMS FOR MONITORING COMPUTERS AND FOR PREVENTING OVERHEATING

(75) Inventor: Memphis Zhihong Yin, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 101 days.

(21) Appl. No.: 09/880,408

(22) Filed: Jun. 13, 2001

(65) Prior Publication Data

US 2003/0002250 A1 Jan. 2, 2003

(51) Int. Cl.$^7$ ................................................ H05K 7/20
(52) U.S. Cl. .................... 361/687; 361/685; 361/692; 361/695; 165/127; 454/184
(58) Field of Search ................... 361/694, 695, 361/686, 687, 688, 692, 697, 106; 364/550, 557, 571.03, 141; 374/169; 340/584, 588, 589, 693, 593, 449, 594, 521, 641; 702/99, 106, 130, 132; 713/500, 501, 503, 609, 322; 395/555, 556, 558, 559, 560

(56) References Cited

U.S. PATENT DOCUMENTS

| | | | | |
|---|---|---|---|---|
| 4,585,339 A | * | 4/1986 | Senoo | 355/69 |
| 4,864,283 A | * | 9/1989 | Seto | 340/584 |
| 5,115,225 A | * | 5/1992 | Dao et al. | 340/584 |
| 5,590,061 A | * | 12/1996 | Hollowell et al. | 702/130 |
| 5,714,938 A | * | 2/1998 | Schwabl | 340/584 |
| 5,764,506 A | * | 6/1998 | Eynaud | 700/12 |
| 5,835,885 A | * | 11/1998 | Lin | 702/99 |
| 6,029,251 A | * | 2/2000 | Williams et al. | 713/501 |
| 6,082,623 A | * | 7/2000 | Chang | 236/49.3 |
| 6,286,109 B1 | * | 9/2001 | Pirdy | 713/340 |
| 6,336,080 B1 | * | 1/2002 | Atkinson | 702/132 |

FOREIGN PATENT DOCUMENTS

| | | | | |
|---|---|---|---|---|
| JP | 09284988 A | * | 10/1997 | H02H/5/04 |
| JP | 10027039 A | * | 1/1998 | G06F/1/20 |
| RU | 2073906 C1 | * | 2/1997 | G05D/23/19 |

* cited by examiner

Primary Examiner—Michael Datskovsky

(57) ABSTRACT

Methods and systems for protecting a computing device are described. Various embodiments provide a computer having a housing that defines an internal cavity. A sensor is mounted on the housing and is configured to sense a temperature of the internal cavity or some other condition associated with the cavity. The sensor generates a signal that can be used to ensure that the computer does not overheat.

14 Claims, 3 Drawing Sheets

METHODS AND SYSTEMS FOR MONITORING COMPUTERS AND FOR PREVENTING OVERHEATING

TECHNICAL FIELD

This invention relates to methods and systems for monitoring electronic equipment to prevent overheating.

BACKGROUND

Computers have become ubiquitous in our society. Their presence has both raised productivity and increased the quality of life. One feature that has allowed the computer to become so valuable is portability. Many of these devices are designed to be portable and thus a single device can be carried by a user and used in different locations. This creates many design challenges to ensure the reliability of the devices.

One common characteristic shared by all computers is that they create heat energy. The heat generated can be detrimental to the device if it is not dissipated or removed in some manner. Computers often rely on air exchange with the ambient environment to cool the device. This works well unless the air exchange is somehow blocked. This condition is especially prevalent in portable computers that are used in a multitude of different environments For example, the user of a portable computer may choose to use the device on a couch, in a bed, or lying on a carpet. In these environments, it may be more likely for air exchange to be blocked by, for example a blanket or pillow. If such a condition goes unnoticed it may be detrimental to the computer.

Accordingly, it is desirable to provide improved systems and methods that reduce the likelihood of a computer overheating.

SUMMARY

Methods and systems for protecting a computing device are described. In one embodiment, a computer is provided and includes a housing that defines an internal cavity. A CPU is mounted within the internal cavity and a sensing circuit is mounted on the housing. The sensing circuit is configured to sense a temperature of the internal cavity. The sensing circuit generates a signal that can be used to ensure that the computer does not overheat when the temperature of the internal cavity reaches a definable threshold.

In another embodiment, the computer has at least one ventilation structure in the housing which allows air to enter the internal cavity. The computer also has a sensing circuit comprising a photo-sensor mounted on the housing and positioned to sense light entering the internal cavity through a ventilation structure. The circuit generates a signal responsive to a condition that indicates that light is not entering the internal cavity in an amount that suggests that the ventilation structure is unblocked.

In another embodiment, a method for protecting a computer comprises sensing an area proximate a ventilation structure in a computer housing and generating a signal if an object at least partially blocks the ventilation structure.

BRIEF DESCRIPTION OF THE DRAWINGS

The same numbers are used throughout the drawings to reference like features and components.

DETAILED DESCRIPTION

Overview

In accordance with the various embodiments described below, the methods and systems sense an area proximate a ventilation structure of a computer and generate a signal if blockage of the ventilation structure occurs.

The computing device can comprise any suitable computer, examples of which include, but are not limited to stationary personal computers, portable computers, cell phones, Palm Pilot brand computers and similar products, game or entertainment computers such as Game Boy brand computers, and the like.

Exemplary Embodiment

Figure 1:
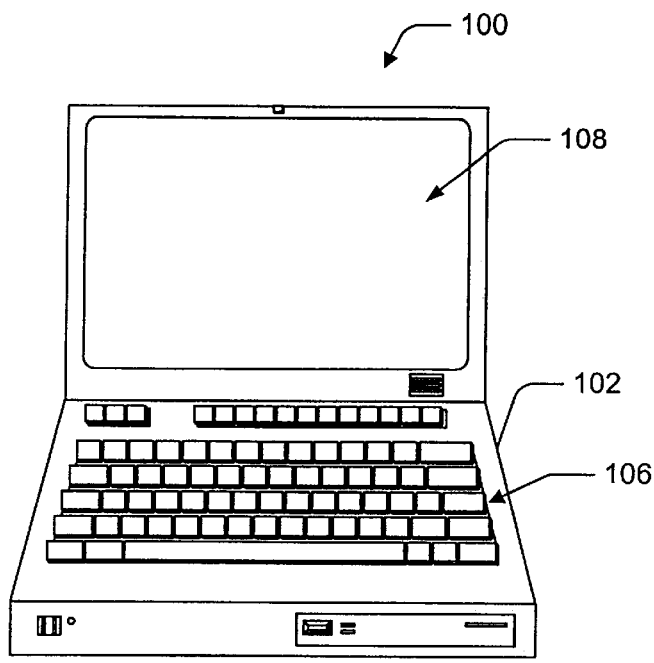
FIG. 1 is a view of an exemplary notebook computer in an open position.
Figure 2:
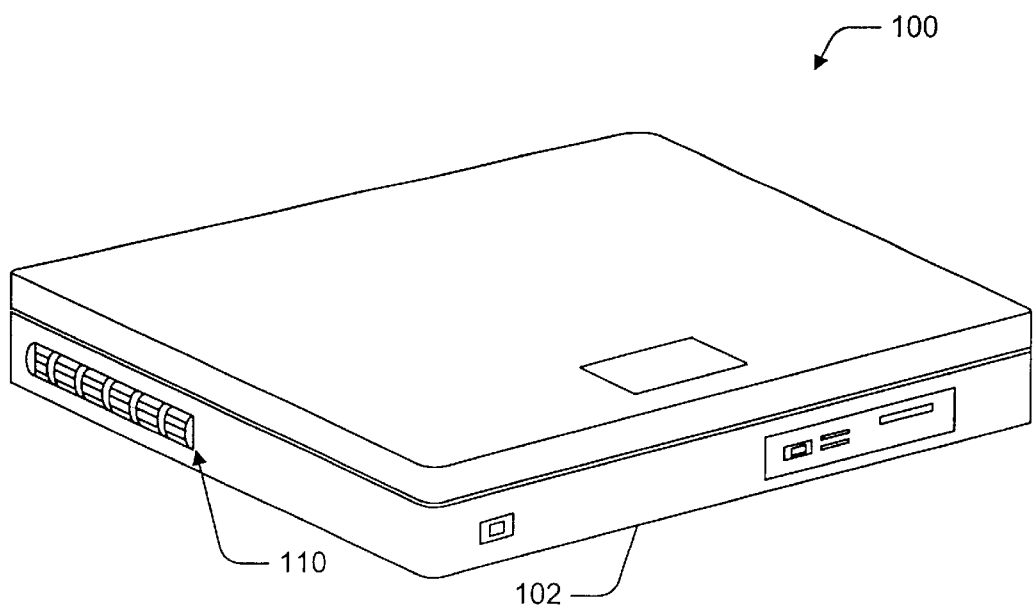
FIG. 2 is a view of an exemplary notebook computer in a closed position.
Figure 3:
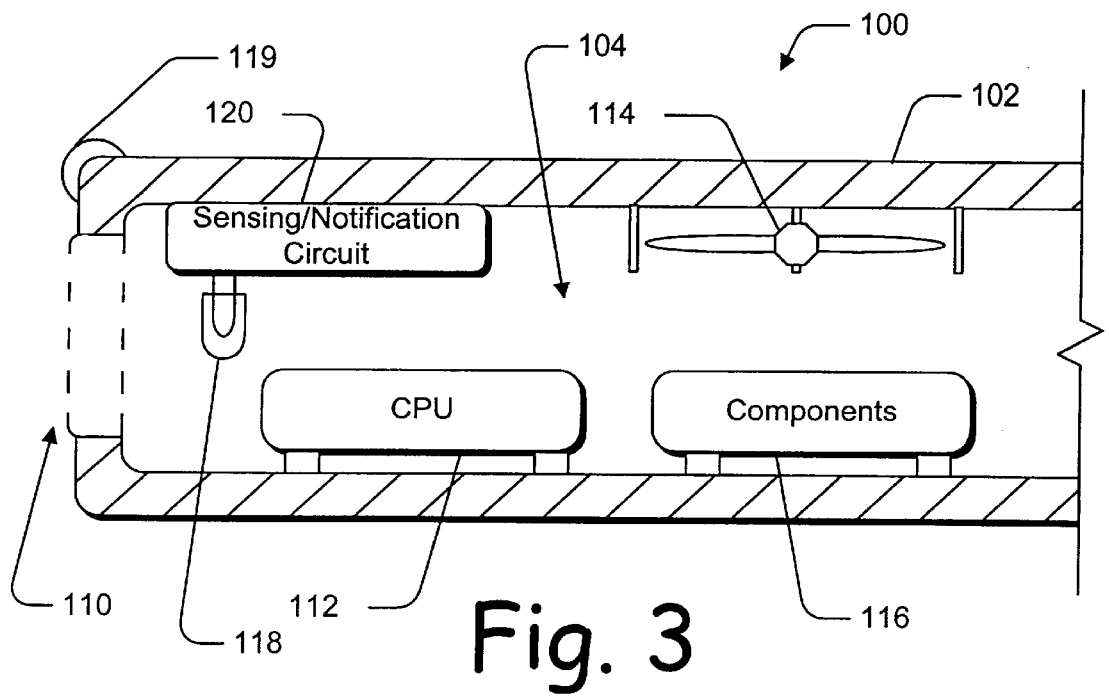
FIG. 3 is a cross-section of an exemplary computer.

FIGS. 1–3 show an exemplary computer in accordance with one embodiment. The computer can comprise any suitable computer as described above. In this particular example, the computer comprises a notebook computer. Computer 100 comprises a housing 102 that defines an internal cavity 104 (FIG. 3) inside of which internal components of the computer are housed. The computer also includes a keyboard 106 and a display 108. The computer's housing also includes a ventilation structure 110. The ventilation structure is provided so that air can flow into and out of the internal cavity.

Airflow is desirable for maintaining a temperature within the cavity that promotes normal computer operation. Specifically, without ventilation structure 110, it is quite likely that the internal components of the computer might overheat due to heat generation issues that are typically associated with computer operation.

FIG. 3 is a cross-section of the computer showing a portion of the internal cavity in a little more detail. Specifically shown is a CPU 112, a cooling fan 114, and a module 116 designated "components." These "components" can comprise printed circuit boards, memory modules, and various other components that are typically provided within a computer's housing. A sensor 118 is also provided within the internal cavity. One purpose of the sensor is to sense conditions which could lead to a computer overheating. Accordingly, the sensor decreases the likelihood that the computer will overheat. Mounted on the housing is notification device 119 which is described further in FIG. 4. The sensor 118 and notification device 119 can be components of a sensing/notification circuit 120, which is described in FIG. 4.

Figure 4:
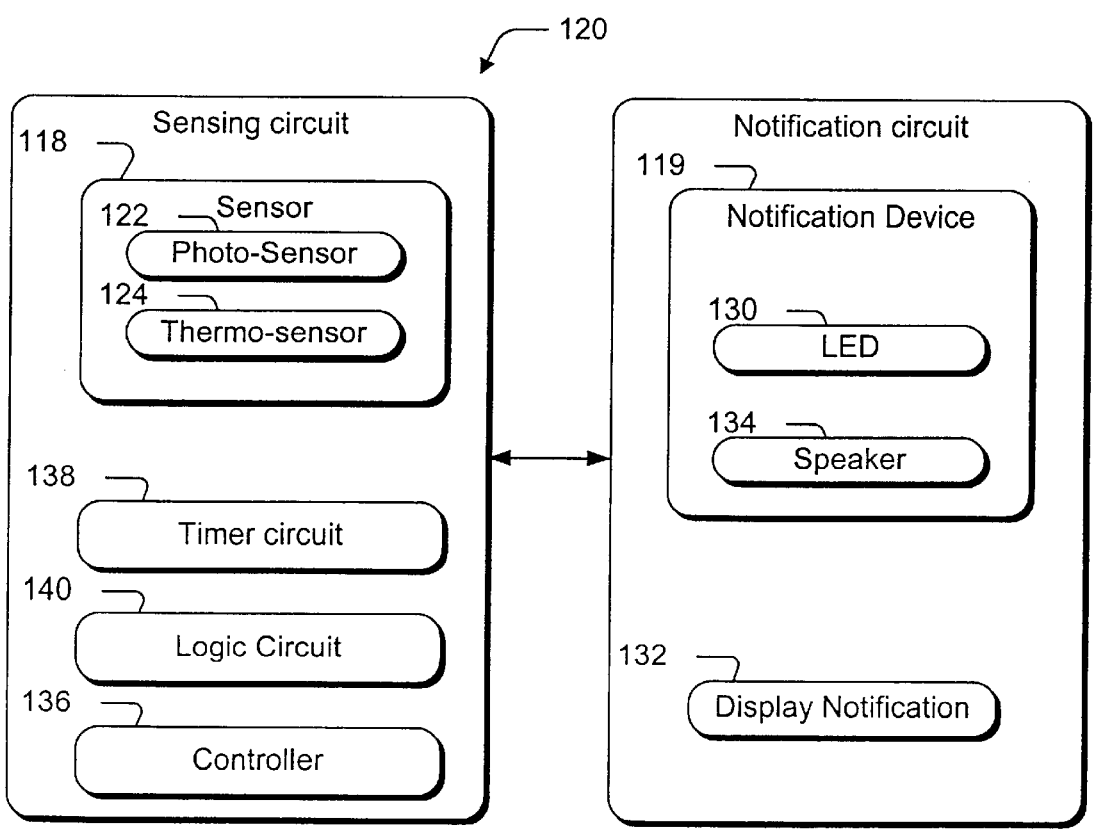
FIG. 4 is a block diagram of an exemplary sensing/notification circuit.

FIG. 4 further illustrates one non-limiting embodiment of the sensing circuit. For the sake of illustration, the sensing/notification circuit 120 is broken into two distinct structures, a sensing circuit and a notification circuit, which are functionally coupled. It is not essential to the embodiments described herein that all of these elements exist, or that these two circuits exist independently. Rather, one skilled in the art will readily see many other configurations which provide functional embodiments. In some embodiments the sensing/notification circuit can comprise the sensing circuit without a notification circuit element. Likewise, some embodiments can have a sensor coupled to a notification circuit without a sensing circuit.

Other embodiments use a combination of applicable sensors and circuitry. Several types of sensors can be utilized in various embodiments. Exemplary non-limiting examples are photo-sensors 122 and thermo-sensors 124.

In one embodiment a photo-sensor 122 can be a component of the sensing/notification circuit 120. The photo-sensor is mounted on the housing 102 and is positioned to sense light entering the internal cavity through the ventilation structure 110. The sensing/notification circuit 120 is configured to generate a signal responsive to a condition that indicates that light is not entering the internal cavity in an amount that suggests that the ventilation structure is unblocked.

For example, a person using a notebook computer in the evening might lie down on a bed to complete some of the day's work. The sensing circuit would sense ambient light entering through the ventilation structure. If a pillow fell against the ventilation structure it would cut off the light and the airflow into the internal cavity. The sensing circuit would then generate a signal which results in a user notification. The user, perceiving the notification, would remove the pillow, thus preventing overheating of the computer.

As discussed above, in some embodiments, if the ventilation structure is blocked, the sensing/notification circuit can generate a signal which results in a notification being generated for the user. The purpose of the notification is to alert a user that blockage may be occurring. Exemplary non-limiting examples of user notification include a visual notification or an audio notification. In one embodiment, a visual notification is displayed by the notification device 119.

The notification device can comprise an LED 130 which is mounted on the computer housing so that it is visible to a computer user. The LED can light-up or blink in any way that is likely to be noticed by the user. Alternatively, the signal/notification circuit can generate a display notification 132 that can appear on display 108. For example, on a Windows® based computer the display notification can be similar to the rectangular information window which displays various important messages for the user. The notification can be superimposed over the current display window so that it is easily noticed.

In another embodiment, an audio notification can be produced on notification device 119. In this embodiment, notification device 119 comprises a speaker 134, and an audio notification can be generated on the speaker. It is recognized that most computers have existing speakers and while a dedicated speaker is shown in the drawings for the purpose of illustration, it is not essential to the present embodiment. The system described will work equally well with any other speaker associated with the computer.

For the purpose of clarity, several distinct ways of notifying the user have been described. One skilled in the art will recognize other ways of increasing the likelihood that a computer user perceives the notification. For example, it may be beneficial to combine two or more types of notification, i.e. a visual notification can be displayed on the computer display, and an audio notification created. In this way, if the user is in front of the screen the visual method should be adequate, but if the user is doing something else, the audio notification may get their attention.

To further protect the computer in case the user does not perceive or respond to the notification, the computer can be shut down responsive to the signal being generated by the sensor. The shutdown can occur immediately, or alternatively, after the signal is generated for a definable period of time. The delay allows time for the user to correct the condition without having the computer shut down. Yet, if the user fails to correct the condition, the computer is protected.

One skilled in the art will recognize many combinations of components which can achieve a computer shutdown. The means for shutting down the computer can be constructed using the components described in FIG. 4. In one embodiment, the computer shutdown can be achieved with controller 136.

For example, the controller can be connected to the sensor 118 and the computer's power supply (not shown) so that if a signal is received from the sensor, the computer is shut down. If a delay in shutting down the computer is desired, timer circuit 138 can be connected to controller 136 so that the shutdown occurs only after a definable period of time. In another example, the same functional means can be achieved using logic circuit 140.

Various components are described in FIG. 4 that can be used to shut down the computer if an overheating condition is detected by the sensor. However, one skilled in the art will readily see other ways to carry out the present embodiment. For example, most computers already have a built-in time-keeping capability somewhere in the hardware or software. One skilled in the art could easily construct a delay means for shutting down the computer using the computer's existing time keeping capability.

Exemplary Second Embodiment

In another exemplary embodiment, the sensing/notification circuit 120 comprises a thermo-sensor 124 which senses a temperature of the internal cavity. The sensing circuit generates a signal that can be used to keep the computer from overheating.

For example, the thermo-sensor can be mounted inside the cavity and connected to an LED. If the thermo-sensor measures a temperature above the average recommended operating temperature for the computer, or any other threshold that might be set, the thermo-sensor can generate a signal which results in the LED being illuminated. Of course, all of the other notification mechanisms discussed above can be employed.

Exemplary Method

In the discussions above and below, certain aspects of the described embodiments can be implemented in terms of software instructions that reside on a computer readable medium. These instructions, when executed by a computer or processor, are configured to implement a design functionality. This functionality will be described in this document in flow chart form.

Figure 5:
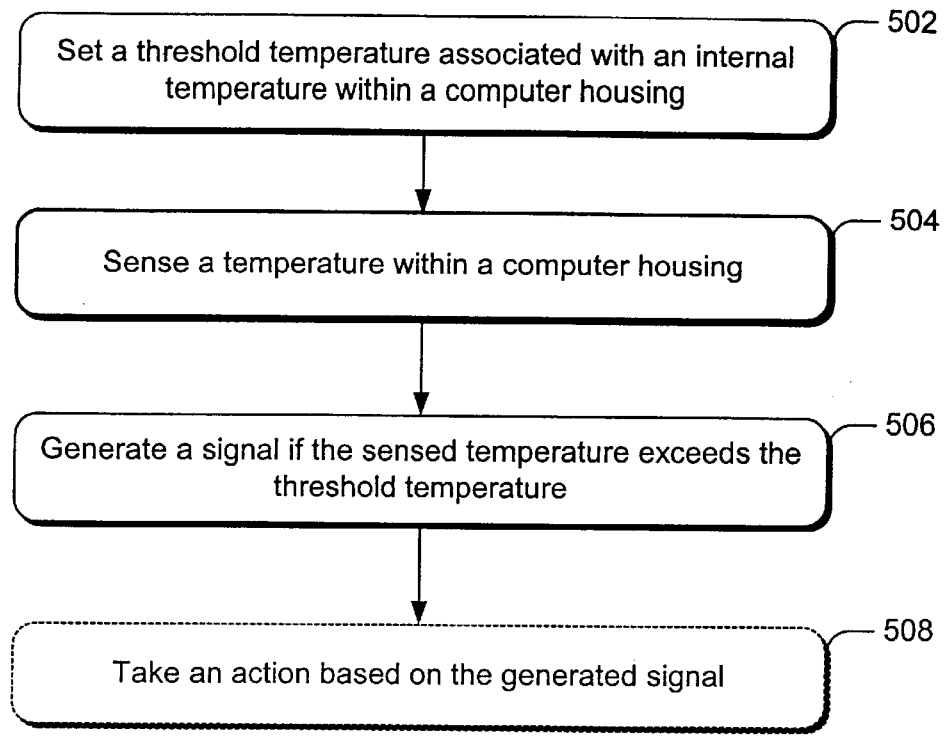
FIG. 5 is a flow diagram that describes steps in a method in accordance with one embodiment.

FIG. 5 is a flow diagram that describes steps in a method in accordance with one described embodiment. The steps can be implemented by way of the exemplary computer of FIG. 3 operating in conjunction with the sensing/notification circuit of FIG. 4. The method can also be practiced through the use of any other suitable hardware, software, firmware, or combination thereof.

Step 502 sets a threshold temperature associated with a temperature within a computer housing. This temperature can be any temperature above which it is desirable to know the temperature has been exceeded. For example, the temperature selected can be one above which the computer suffers from the possibility of shortened functional lifespan. In another case, the temperature can simply be the average operating temperature of the computer model selected. The temperature can be set by the computer manufacturer, a dealer setting up the computer and software, or a user. In some embodiments the adjustments can be made through the "Settings" and "Control Panel" screen displays.

Once the threshold temperature has been set, step 504 senses a temperature within the computer housing with a sensor 118 that is positioned on the housing. Any appropriate type of sensor can be used with exemplary sensors described above. The sensor can be placed anywhere in the housing where it provides useful information Step 506 generates a signal if the sensed temperature exceeds the threshold temperature. Examples of signals and how they can be used are given above.

In some embodiments, if a signal is generated at step 506, step 508 takes an action based on the generated signal. This action can include shutting down the computer responsive to the signal, or shutting down the computer if the sensed temperature exceeds the threshold temperature for a definable period of time.

Exemplary Second Method

Figure 6:
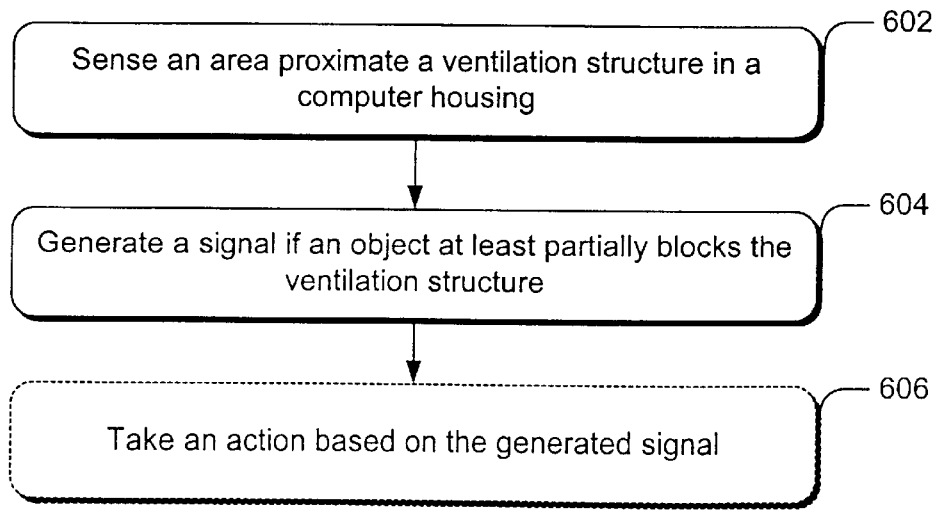
FIG. 6 is a flow diagram that describes steps in a method in accordance with one embodiment.

FIG. 6 is a flow diagram that describes steps in the method in accordance with one embodiment. The method can be implemented with any appropriate combination of software and/or hardware.

Step 602 senses an area proximate a ventilation structure in a computer housing. Sensing can be implemented through multiple different embodiments, as described above. For example, a photo-sensor 122 can be utilized by positioning it so that light entering the internal cavity through the ventilation structure can be sensed. Another example uses a thermo-sensor 124 positioned inside the internal cavity which senses the temperature of the internal cavity. In this example if an obstruction occurs the internal temperature sensed by the thermo-sensor will likely rise.

Step 604 generates a signal if an object at least partially blocks the ventilation structure. Several non-limiting examples of this step have been described above.

Step 606 takes an action based on the generated signal. Exemplary actions can include shutting the computer down responsive to the signal and shutting the computer down if the signal persists for a definable period of time.

CONCLUSION

By monitoring the internal conditions of a computer, such as whether there is adequate airflow, and the internal housing temperature, the likelihood of inadvertent damage from overheating is decreased. This, in turn can lead to increased computer efficiency.

Although the invention has been described in language specific in structural features and/or methodological steps, it is to be understood that the invention defined in the appended claims is not necessarily limited to the specific features or steps described. Rather, specific features and steps are disclosed as preferred forms of implementing the claimed invention.

What is claimed is:

1. A computer, comprising:
   a housing defining an internal cavity;
   at least one ventilation structure in the housing which allows air to enter the internal cavity; and
   a sensing circuit comprising a photo-sensor mounted on the housing and positioned to sense light entering the internal cavity through the at least one ventilation structure, the sensing circuit being configured to generate a signal responsive to a condition that indicates that light is not entering the internal cavity in an amount that suggests that the at least one ventilation structure is unblocked.

2. The computer as claimed in claim 1, wherein the signal generated by the sensing circuit results in an audio notification being generated.

3. The computer as claimed in claim 1, wherein the signal generated by the sensing circuit results in a visual notification being generated.

4. The computer as claimed in claim 1, wherein the signal generated by the sensing circuit results in an audio notification and a visual notification being generated.

5. The computer as claimed in claim 1, wherein the signal generated by the sensing circuit causes the computer to shutdown.

6. The computer as claimed in claim 1, wherein the computer is a notebook computer.

7. A computing device comprising:
   a housing;
   a sensing circuit positioned within the housing and configured to generate a signal responsive to sensing a condition which could lead to the computing device overheating, wherein said signal causes a user notification to be generated, and wherein if the sensing circuit continues to generate said signal for a definable amount of time after the user notification is generated said signal causes the computing device to shut down.

8. The computing device of claim 7, wherein the user notification comprises an audio notification and a visual notification.

9. The computing device of claim 7, wherein the user notification comprises a visual notification displayed on an LED.

10. A computing device comprising:
    a housing defining an internal cavity;
    a CPU mounted within the internal cavity; and,
    a sensing circuit mounted on the housing and configured to sense a temperature of the internal cavity, the sensing circuit being configured to generate a signal that can be used to ensure that the computing device does not overheat if the temperature reaches a definable threshold, wherein the signal causes a user notification to be generated by the CPU, and wherein if the signal persists for a given period of time subsequent to the user notification, then the signal causes the computing device to shut down.

11. The computer as claimed in claim 10, wherein the user notification comprises an audio notification.

12. The computer as claimed in claim 10, wherein the user notification comprises a visual notification.

13. The computer as claimed in claim 10, wherein the user notification comprises an audio notification and a visual notification.

14. The computer as claimed in claim 10, wherein the sensing circuit is mounted within the housing.

* * * * *